United States Patent
Shipley et al.

(10) Patent No.: US 7,316,606 B2
(45) Date of Patent: Jan. 8, 2008

(54) AUXILIARY AIRFLOW SYSTEM

(75) Inventors: James C Shipley, Gilbert, AZ (US);
Javier Leija, Chandler, AZ (US);
Christopher A Gonzales, Chandler, AZ (US); Christopher D Lucero, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/053,727

(22) Filed: Feb. 8, 2005

(65) Prior Publication Data
US 2006/0199498 A1 Sep. 7, 2006

(51) Int. Cl.
*H05K 5/00* (2006.01)

(52) U.S. Cl. ............... 454/184; 454/185; 361/695; 361/696; 312/236

(58) Field of Classification Search ............ 454/184, 454/185; 361/695, 696; 312/236
See application file for complete search history.

(56) References Cited

U.S. PATENT DOCUMENTS

| | | | | |
|---|---|---|---|---|
| 5,460,441 A | * | 10/1995 | Hastings et al. | 312/298 |
| 5,467,250 A | * | 11/1995 | Howard et al. | 361/696 |
| 5,484,012 A | | 1/1996 | Hiratsuka | |
| 5,562,410 A | * | 10/1996 | Sachs et al. | 415/213.1 |
| 5,721,670 A | * | 2/1998 | Cochrane et al. | 361/695 |
| 5,851,143 A | * | 12/1998 | Hamid | 454/57 |
| 5,871,396 A | * | 2/1999 | Shen | 454/184 |
| 5,927,389 A | * | 7/1999 | Gonsalves et al. | 165/121 |
| 6,104,003 A | * | 8/2000 | Jones | 219/400 |
| 6,236,564 B1 | * | 5/2001 | Fan | 361/695 |
| 6,294,762 B1 | * | 9/2001 | Faries et al. | 219/400 |
| 6,297,957 B1 | * | 10/2001 | Johnson et al. | 361/687 |
| 6,400,568 B1 | * | 6/2002 | Kim et al. | 361/697 |
| 6,711,013 B2 | * | 3/2004 | Wobig et al. | 361/687 |
| 6,765,795 B2 | * | 7/2004 | Modica | 361/695 |
| 6,826,048 B1 | * | 11/2004 | Dean et al. | 361/695 |
| 6,847,013 B2 | * | 1/2005 | Audette et al. | 219/400 |
| 2003/0218465 A1 | | 11/2003 | Rijken et al. | |
| 2004/0057205 A1 | | 3/2004 | Chen et al. | |
| 2004/0264125 A1 | | 12/2004 | Cheng et al. | |
| 2005/0006085 A1 | | 1/2005 | Nelson | |

OTHER PUBLICATIONS

Related PCT Application Intel Ref: *International Search Report and Written Opinion of the Inernational Searching Authority*; Dated Aug. 4, 2006; PCT/US2006/001918, 12 pgs.
Chu, et al., "Uninterupable Modular Air-Cooled System", *IBM Technical Disclosure Bulletin*, May 1973, 3654-3655 Pgs.

* cited by examiner

*Primary Examiner*—Derek S. Boles
(74) *Attorney, Agent, or Firm*—Grossman, Tucker, Perreault & Pfleger, PLLC

(57) ABSTRACT

A method according to one embodiment may include providing a chassis comprising at least one selectively deployable fan disposed within the chassis. The method of this embodiment may also include moving the fan from a stowed configuration to a deployed configuration within the chassis and energizing the at least one fan. Of course, many alternatives, variations, and modifications are possible without departing from this embodiment.

20 Claims, 6 Drawing Sheets

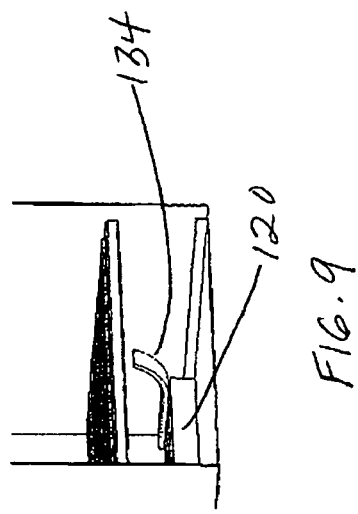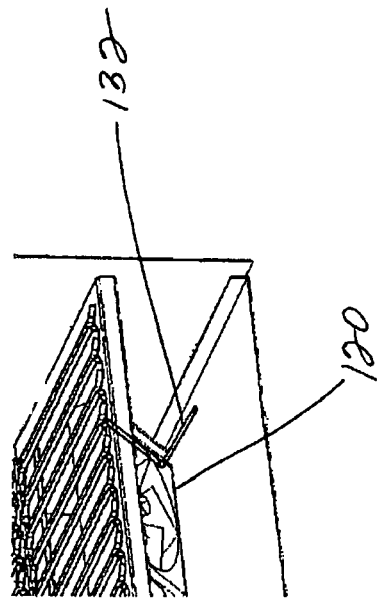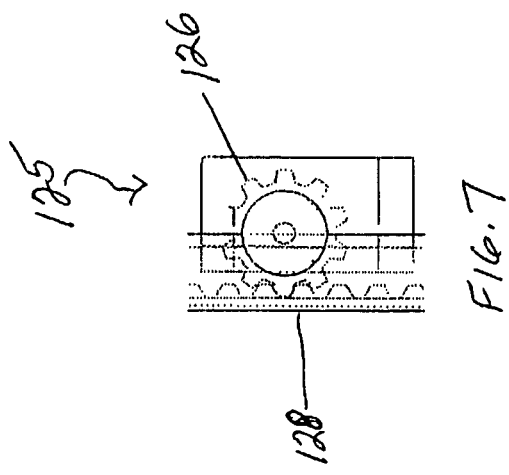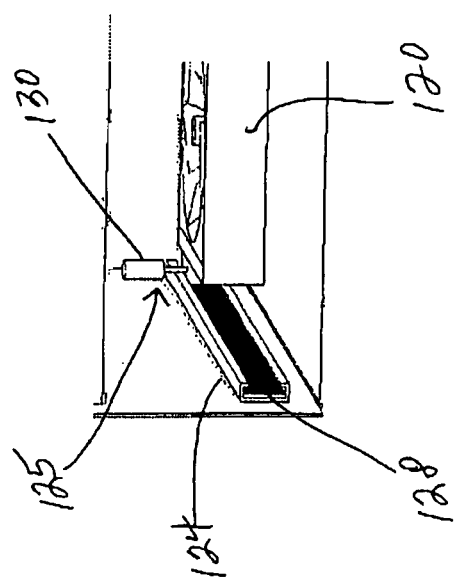

AUXILIARY AIRFLOW SYSTEM

FIELD

The present disclosure relates to airflow control systems, apparatus, and methods for computer and electronics equipment.

BACKGROUND

Overheating can cause computer and electronic systems to fail or suffer a decrease in performance. Thermal management for computer and electronics equipment is, therefore, a significant concern. Ever increasing processor speeds, circuit board densities, and form factor densities have exacerbated the problem of thermal management by increasing the amount of heat that can be generated by computer systems or other electronics systems. In a conventional computer or electronics system, heat generated by various components of the system is often removed through convective cooling of the various individual components, or of commonly housed components using a chassis cooling system. Frequently, computer or electronics systems are cooled using forced convention. In a forced convection cooling system a fan may be used to circulate air within a housing or chassis of the computer or electronics system. In many systems, the fan may be used to force the intake of air from the exterior of the computer or electronics system, and to pass the air through the housing or chassis, and exhaust heated air from housing or chassis.

While forced convection cooling systems may provide adequate cooling of the computer or electronics system, the cooling needs of the system are not always constant. Increases in power consumption by components, for example resulting from increases in processor usage demands, etc., may result in an increase in the heat generated by a computer or electronics systems. The increase in the heat generated by the computer or electronics system may typically result in an increase in the amount of heat that must be dissipated. Similarly, increases in ambient temperature, etc. may result in a decrease in the cooling efficiency achieved through convective cooling. Designing a cooling system capable of accommodating these varying cooling capacities is often problematic. A cooling system designed to provide adequate cooling during adverse conditions will be inefficient during typical operation, wasting energy and causing excessive acoustic pollution. However, if the cooling system is only designed for typical cooling requirements, the cooling system may be unable to provide adequate cooling during adverse conditions, such as high processor demands or high ambient temperatures, especially over prolonged periods of time. Insufficient cooling capacity may result in damage to the computer or electronics systems, or components and/or diminution in performance of the computer or electronics system.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 7 is a detailed view of an embodiment of a deployment system consistent with the present disclosure including a rack and pinion arrangement;

FIG. 8 is a detailed perspective view of an embodiment of a deployment system consistent with the present disclosure including a rack and pinion arrangement;

FIG. 9 is a detailed perspective view of an embodiment of a rotation system consistent with the present disclosure including a guide rail;

FIG. 10 is a detailed perspective view of an embodiment of a rotation system consistent with the present disclosure including a leaf spring.

Although the following Detailed Description will proceed with reference being made to illustrative embodiments, many alternatives, modifications, and variations thereof will be apparent to those skilled in the art. Accordingly, it is intended that the claimed subject matter be broadly viewed.

DETAILED DESCRIPTION

Figure 1:
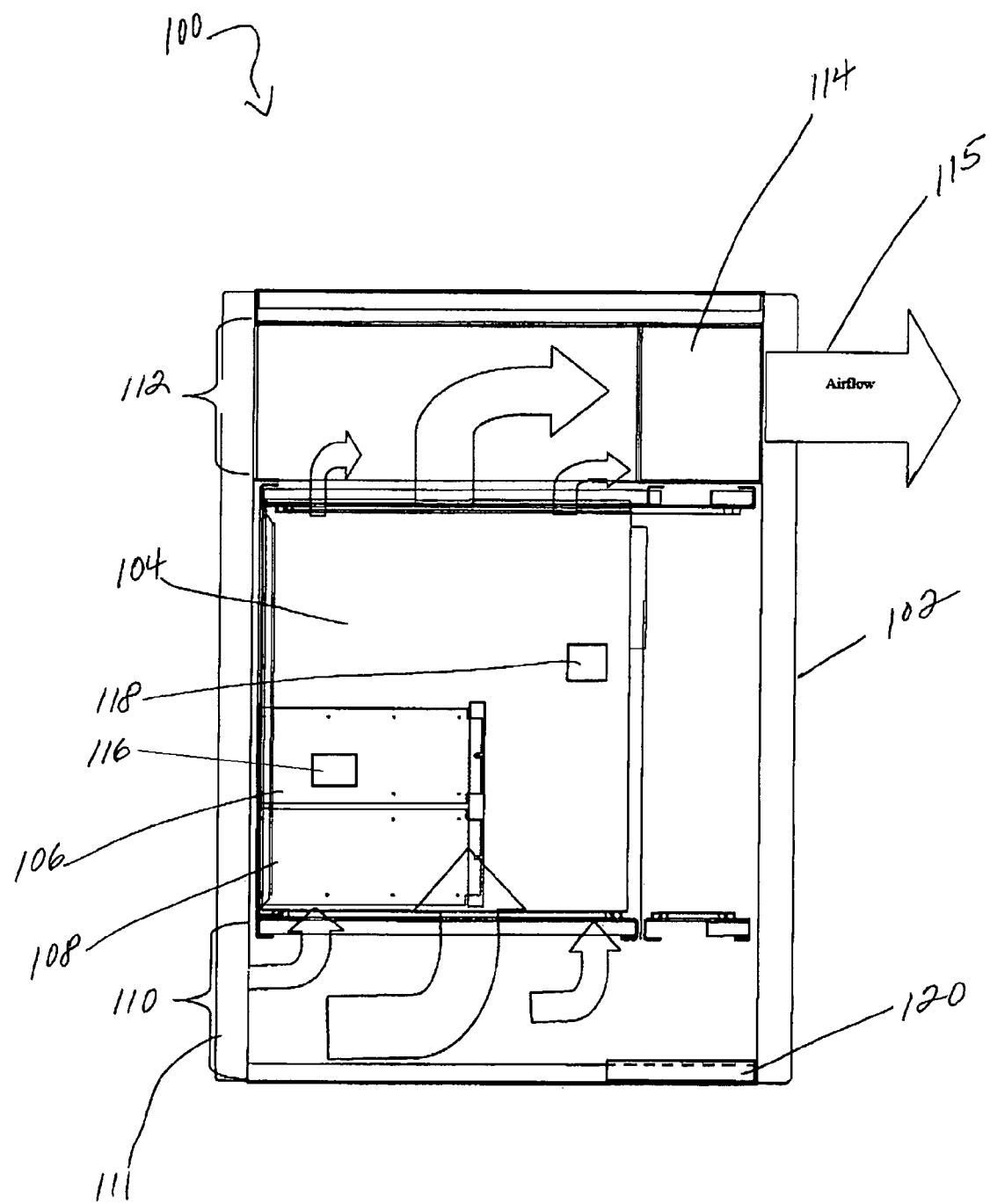
FIG. 1 schematically depicts a side cross-section view of an embodiment of an auxiliary cooling system consistent with the present disclosure.

With reference to FIG. 1, a computer or electronics system 100 consistent with the present disclosure is illustrated. As schematically depicted, the system 100 may be implemented in a chassis 102 for a computer or other electronics system. As shown, the chassis 102 may include one or more circuit boards 104 disposed within the chassis 102. One or more smaller circuit boards, or cards, 106, 108 may be capable of being coupled to the circuit board 104. The chassis 102 may further include a primary cooling system including an air inlet plenum 110 permitting the flow of air into the chassis 102. The primary cooling system may further include a fan tray region 112 having one or more fans 114 disposed therein. In the illustrated embodiment, the fans 114 may create airflow through the chassis 102, as schematically depicted by the arrows in FIG. 1. As shown, air may enter the chassis 102 through the air intake region 111 of the air inlet plenum 110 at the front of the chassis 102. The air may be drawn through the chassis 102 to the fans 114 and expelled through an exhaust region 115 at the rear of the chassis 102. The airflow through the chassis 102 may convectively cool any heat generating components disposed within the chassis 102, for example heat generating components 116, 118 disposed on the circuit board 104 and/or circuit cards 106, 108. Accordingly, the temperature within the chassis 102 may be, at least in part, a function of the cooling capacity of the primary cooling system.

According to one embodiment the chassis 102 may be an Advanced Telecommunications Computing Architecture (advanced TCA or ATCA) chassis, complying with, or compatible with, PCI Industrial Computer Manufacturers Group (PICMG), Advanced Telecommunications Computing Architecture (ATCA), Base Specification, PIGMG 3.0 Revision 1.0, published Dec. 30, 2002. According to such an embodiment, the circuit board 104 disposed within the chassis 102 may be an ATCA board, also referred to as an ATCA blade. Various other attributes, including the size and configuration of the primary cooling system, e.g., the air inlet plenum 110, fan tray 112, and fans 114, may be dictated by the system specification. The chassis and/or any components disposed therein may be provided having a form factor and/or complying with a specification other than the advanced telecommunications computing architecture specification recited above.

In addition to the primary cooling system, the computer or electronics system 100 may include a selectively deployable auxiliary cooling system that may increase the airflow through the chassis 102 to temporarily and/or selectively increase the cooling capacity of the chassis 102. The auxiliary cooling system may, therefore, be useful for increasing the cooling of the chassis 102, by increasing the airflow through the chassis, for example during times of increased ambient temperature or increased internal chassis temperature, which may result, for example, from an increase in the usage and/or power consumption of electronic components, etc. disposed within the chassis 102.

As depicted in FIG. 1, the auxiliary cooling system may include a fan assembly 120 that is selectively deployable. When additional cooling, which may be provided by the auxiliary cooling system, is not needed or desired, the fan assembly 120 may be stowed, for example in the air inlet plenum 110 as shown in the illustrated embodiment. In an embodiment herein, the fan assembly 120 may be stowed in a flat or horizontal orientation in a rear portion of the air inlet plenum 110 away from the front or air intake region 111 of the air inlet plenum 110. As such, when the fan assembly 120 is in a stowed configuration the fan assembly 120 may have a minimal and/or relatively small effect and/or restriction on the airflow through the chassis 102 provided by the primary chassis cooling system.

Figure 2:
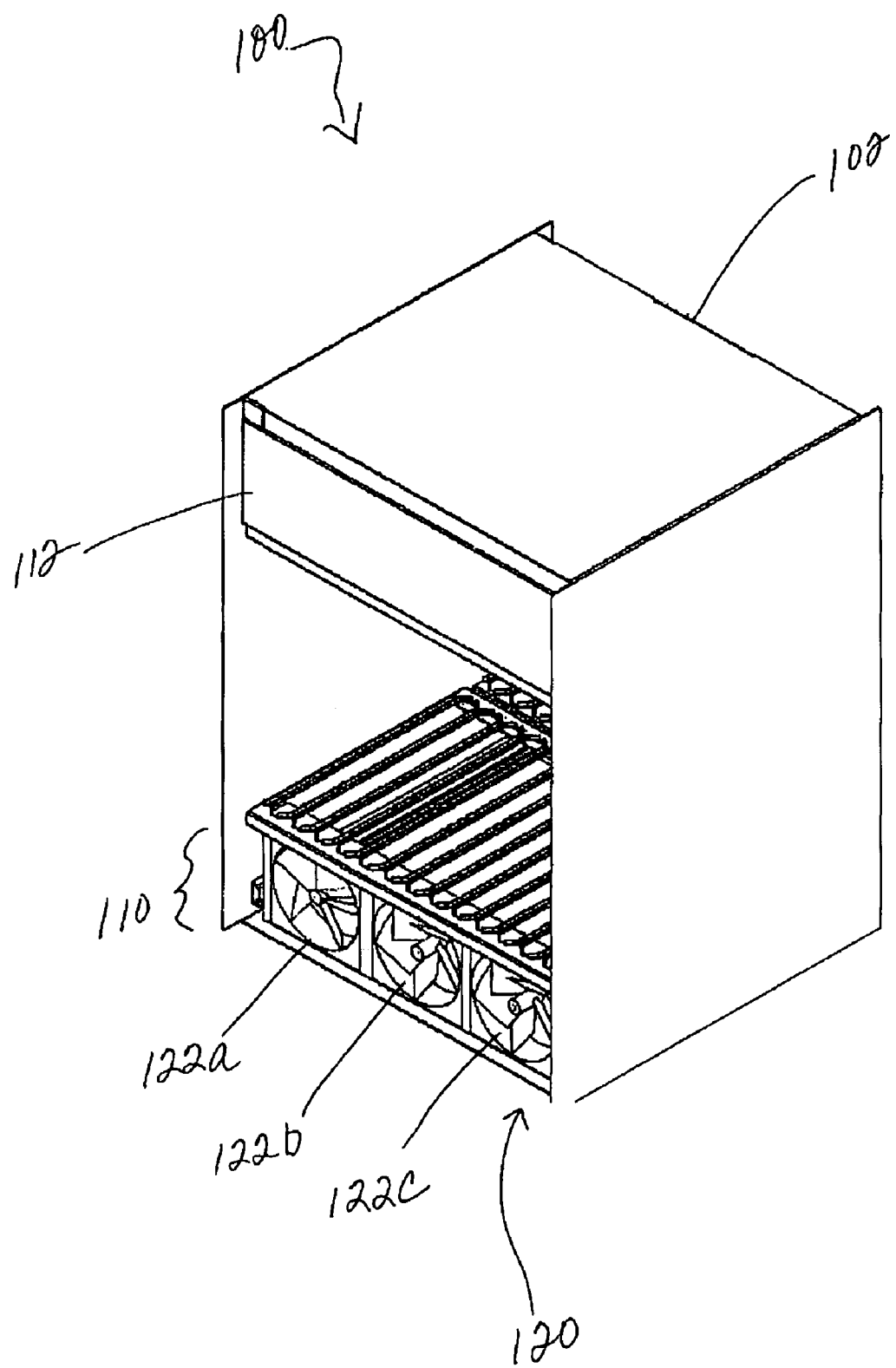
FIG. 2 is a schematic perspective view of a chassis including an auxiliary cooling system with a fan assembly consistent with the present disclosure in a deployed configuration.

Turning to FIG. 2, an embodiment of an auxiliary cooling system consistent with the present disclosure is depicted with the fan assembly 120 in a deployed configuration. When additional cooling is needed and/or desired, the fan assembly 120 may be moved from the stowed configuration to a deployed configuration. As shown, the fan assembly 120 may include one or more fans 122A, 122B, 122C. As illustrated, when the fan assembly 120 is in a deployed configuration the fans 122A, 122B, 122C may be positioned in a generally upright or vertical orientation and may be disposed at and/or adjacent to the front, or intake region 111, of the air inlet plenum 110. Accordingly, deployment of the fan assembly 120 may include positioning the fan assembly 120 adjacent to the intake region 111 of the air inlet plenum 110 and orienting the fan assembly 120 in a generally upright or vertical position. According to various alternative embodiments, the fan assembly may be provided having an angled orientation in the deployed configuration. In such an embodiment, when the fan assembly is in a deployed configuration, the fan assembly may have an orientation other than generally upright or vertical.

While three fans 122A, 122B, 122C are depicted in the illustrated embodiment, an auxiliary cooling system consistent with the present disclosure may include at least one fan. The one or more fans 122A, 122B, 122C of the fan assembly 120, may have any suitable configuration for increasing the airflow through the chassis 102. According to one embodiment, the one or more fans 122A, 122B, 122C of the fan assembly, may be conventional 120 mm×38 mm tube axial fans, such as may conventionally be used in connection with cooling systems for computer and or electronics equipment. Fans of this variety may provide a relatively large flow rate while generating relatively low acoustic noise. An auxiliary cooling system consistent with the present disclosure is not, however, limited to the use of such specific fans. Numerous other size fans, e.g. 92 mm, 80 mm, etc., may suitably be employed. Similarly, an auxiliary cooling system consistent with the present disclosure is not limited to axial fans. Other fan configurations, e.g., radial fans, may also be employed herein. Various other fan sizes and configurations may also suitably be employed in connection with an auxiliary cooling system consistent with the present disclosure.

Figure 3:
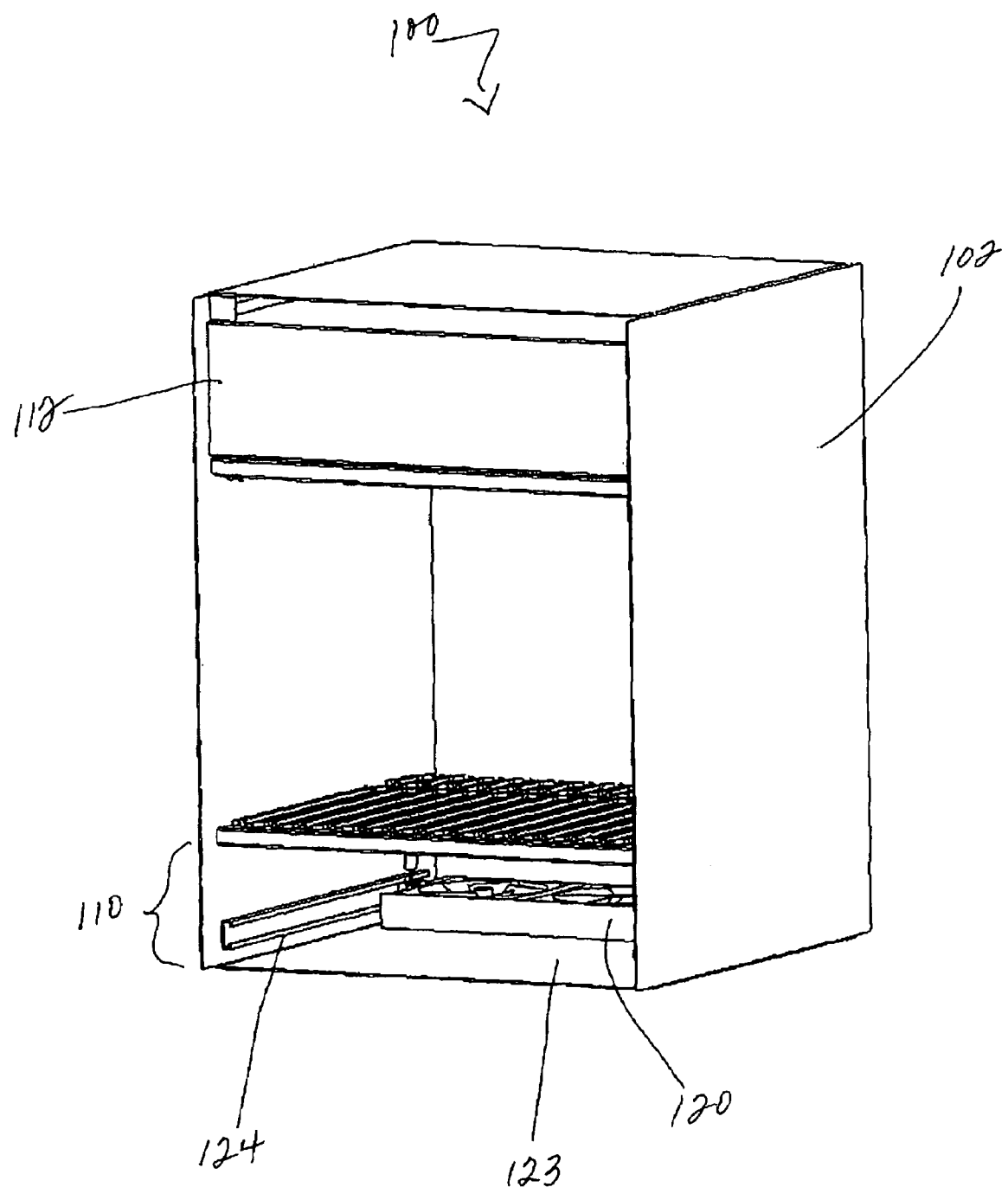
FIG. 3 is a schematic perspective view of a chassis including an auxiliary cooling system consistent with the present disclosure with the fan assembly in a stowed configuration.

Referring next to FIG. 3, the system 100 is shown with the fan assembly 120 in a stowed configuration. As illustrated, when the fan assembly 120 is in a stowed configuration the fan assembly may be disposed at, or adjacent to, the rear of the air inlet plenum 110 of the chassis 102. Additionally, as mentioned above, when the fan assembly 120 is in the stowed configuration, the fan assembly 120 may be arranged in a generally horizontal or flat orientation, e.g. oriented generally 90 degrees relative to the deployed orientation of the fan assembly 120 depicted in FIG. 2. The horizontally arranged fan assembly 120 may be disposed on, or adjacent to, a bottom surface 123 of the air inlet plenum 110. When the fan assembly 120 is in the stowed configuration shown in FIG. 3, the fan assembly 120 may have only a small effect on the airflow through the chassis 102, i.e., the fan assembly 120 may impart only a small restriction and/or resistance on airflow through the chassis 102.

Consistent with the illustrated embodiment, the fan assembly 120 may deploy at, or adjacent to, the front of the chassis 102 and may be oriented in an upright position relative to the chassis 102. The fan assembly 120 may be stowed at, or adjacent to, the rear of the chassis 102, and may be oriented in a horizontal position. In such an embodiment, deployment of the fan assembly 120 may include moving or translating the fan assembly 120 toward the front of the air inlet plenum 110 and/or rotation of the fan assembly 120 from a flat or horizontal orientation to an upright or vertical orientation. Therefore, consistent with the illustrated embodiment, deployment of the fan assembly 120 may include both translation and rotation of the fan assembly 120, although other embodiments are contemplated herein.

In an alternative embodiment, the fan assembly may be provided having an angled orientation when the fan assembly is in a deployed configuration. As such, in a deployed configuration the fan assembly may have an orientation other than generally flat or horizontal. In one non-limiting embodiment consistent with the foregoing, an angled configuration of the fan assembly in a deployed configuration may direct airflow into the chassis and/or toward heat generating components, i.e., components having relatively high power dissipation such as processors. Directing the airflow by providing the fan assembly having an angled orientation in the deployed configuration may, for example, increase the velocity of airflow across a heatsink associated with a heat generating component. The increase airflow velocity may increase the cooling capacity of the heatsink.

A fan assembly 120 consistent with the present disclosure may, as described above, be selectively deployable as a unit. Accordingly, the fan assembly 120 be maintained in a stowed configuration until and/or unless additional cooling is needed or desired, for example in the event of increased ambient temperature or in the case of increased internal temperature within the chassis 102, e.g. due to increased usage of electronic components within the chassis 102. When additional cooling is needed or desired, the fan assembly 120 may be moved to a deployed configuration and the one or more fans 122A, 122B, 122C may be energized to increase the airflow through the chassis 102. Additional cooling may, thereby, be provided for the chassis 102. When additional cooling is no longer needed, or is no longer desired, e.g., the temperature within the chassis 102 is at a temperature or an operating range within the capability of the primary cooling system, the fan assembly 120 of the auxiliary cooling system may be moved to a stowed configuration. Moving the fan assembly 120 to the stowed configuration when additional cooling is not needed may remove the airflow resistance through the chassis 102 that may result from the fan assembly 120 being disposed at the intake region 111 and/or within the airflow path through the chassis 102. Removing the fan assembly 120 from the airflow path through the chassis 102 may increase the efficiency of the primary cooling system.

An embodiment of the auxiliary cooling system may be activated, i.e., the fan assembly may be moved from a stowed configuration to a deployed configuration and one or more fans may be energized by an automatic control system and/or a manual control system. According to an embodiment of an automatic control system, one or more temperature sensors may be employed to measure a temperature within the chassis, a temperature of one or more components disposed within the chassis, and/or an ambient temperature surrounding the chassis. The auxiliary cooling system may be activated in response to such a measured temperature. In a related embodiment, the auxiliary cooling system may be activated based on a measured power consumption of one or more components disposed within the chassis. Such measured power consumption may be related to an increase in cooling demand on the primary cooling system.

In addition to the use of an automatic and/or a manual control system for activating/deactivating the auxiliary cooling system, various control systems, or models, may be employed for controlling the operation of the auxiliary cooling system. In one embodiment, a set point controller may be used for controlling the auxiliary cooling system. In such an embodiment, the fan assembly may be deployed and the one or more fans may be energized when a temperature measured by a temperature sensor is above a threshold activation temperature. The auxiliary cooling system may continue to operate until a temperature measured by the same, or a different, temperature sensor is below a threshold deactivation temperature. According to other embodiments, the auxiliary cooling system may be controlled by proportional, proportional-integral-derivative, etc., control systems. An embodiment of an auxiliary cooling system using such alternative control systems may be selectively deployable and may provide varying auxiliary cooling capacity, e.g., by controlling the speed of the one or more fans and/or by energizing less than all of the fans. Accordingly, operation of the auxiliary cooling system may include a feedback control loop or system.

According to further embodiments, activation of the auxiliary cooling system may be predictive, i.e., based on changes in chassis, component, and/or ambient temperature and/or based on changes and/or increases in power consumption of components within the chassis. Such predictive activation of the auxiliary cooling system may activate the auxiliary cooling system before the temperature within the chassis, the temperature of a component within the chassis, and/or the ambient temperature exceeds the cooling capacity of the primary cooling system. In such an embodiment, it may be possible to prevent an overheating condition by activating the auxiliary cooling system before overheating occurs.

As an alternative, or in addition to, the automatic control systems described above, the auxiliary cooling system may be manually controllable. In an embodiment of an auxiliary cooling system having a manual control, the auxiliary cooling system may be manually activated and/or deactivated. In related embodiments, the performance of the auxiliary cooling system may be manually controlled, e.g., by controlling the fan speed and/or by operating less than all of the fans in the fan assembly. Manual control of the auxiliary cooling system may be used alone and/or to supplement an automatic control system, e.g., to achieve better performance of the auxiliary cooling system and/or of the computer or electronics system including the auxiliary cooling system.

Figure 6:
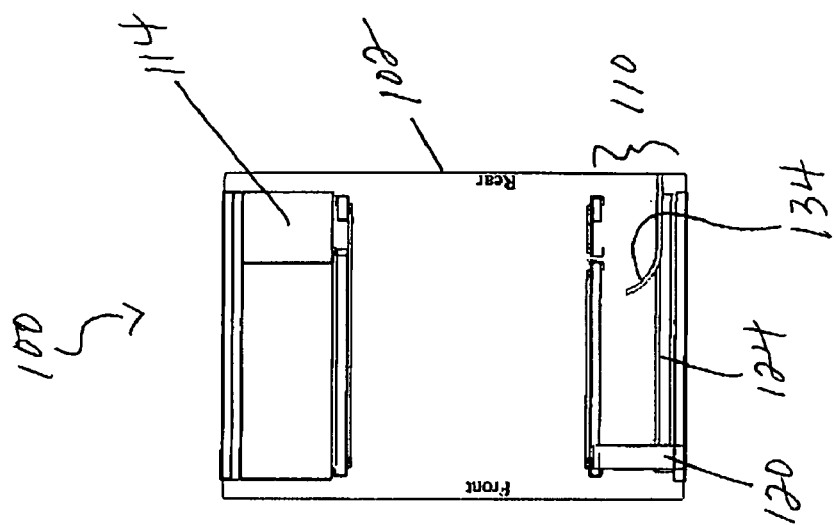
FIG. 6 is a schematic side cross-section view of an auxiliary cooling system consistent with the present disclosure with the fan assembly in a fully deployed configuration.
Figure 5:
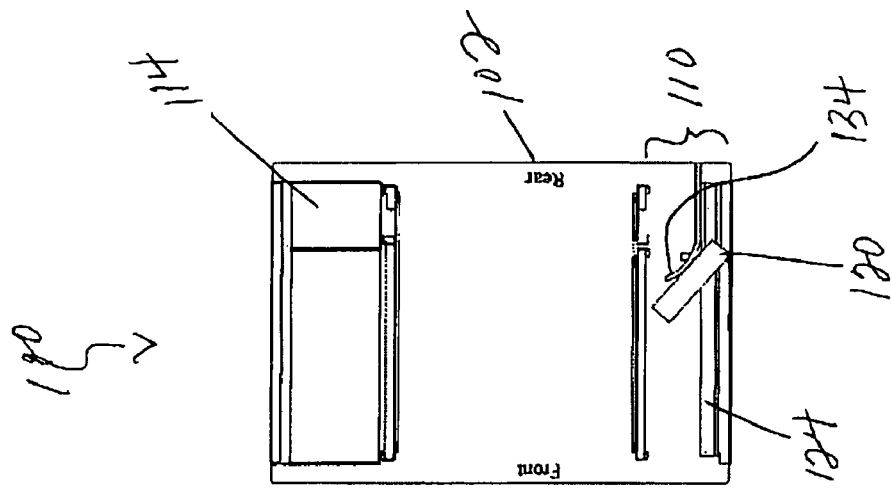
FIG. 5 is a schematic side cross-section view of an auxiliary cooling system consistent with the present disclosure with the fan assembly in a partially deployed configuration.
Figure 4:
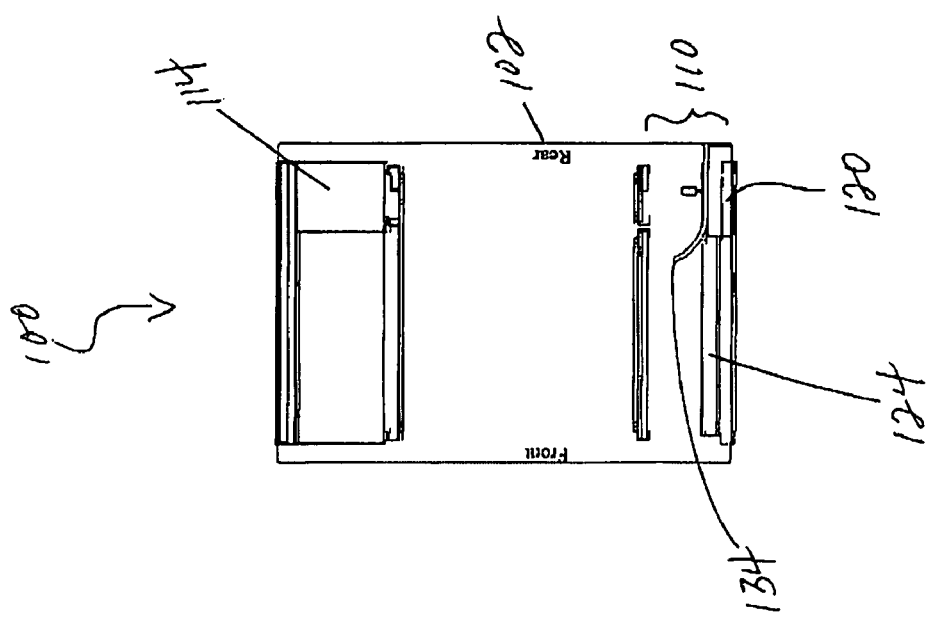
FIG. 4 is a schematic side cross-section view of an auxiliary cooling system consistent with the present disclosure with the fan assembly in a fully stowed configuration.

With additional reference to FIGS. 4 through 6, the fan assembly 120 may move between the stowed configuration and the deployed configuration along guide rails 124. The guide rails 124 may be disposed on one or both sides of the chassis 102 in the air inlet plenum 110. The guide rails 124 may generally extend between the front and the rear of the air inlet plenum 110, i.e., generally between the front and the rear of the chassis 102. The guide rails 124 may be provided as tracks, rails, ribs, etc. that may generally guide the motion of the fan assembly 120 between a stowed configuration and a deployed configuration. According to an embodiment, the guide rails 124 may, at least in part, maintain the fan assembly 120 in a generally parallel path to the chassis 102 in order to prevent the fan assembly 120 from twisting and/or binding when moving between the stowed configuration and the deployed configuration. The fan assembly 120 may include cooperating features capable of riding in and/or on the guide rails 124 and capable of controlling the movement of the fan assembly 120 relative to the guide rails 124.

As schematically depicted in FIG. 4, in a stowed configuration, the fan assembly 120 may be positioned on, or adjacent to, the bottom of the air inlet plenum 110 at the rear of the chassis 102. The fan assembly 120 may deploy by moving toward the front of the chassis 102, with the movement of the fan assembly 120 being generally guided and/or controlled by the guide rails 124. The fan assembly 120 may rotate from the horizontal or flat stowed orientation to a vertical or upright deployed orientation as the fan assembly 120 moves toward the front of the chassis 102, as shown in FIG. 5. In the fully deployed configuration, illustrated in FIG. 6, the fan assembly 120 may be disposed adjacent to the front, or intake region, of the air inlet plenum 110. The fan assembly 120 may be in a generally vertical, or upright, orientation when in the deployed configuration. The fan assembly 120 and/or the chassis 102 may include one or more switches or other activating mechanisms. The one or more fans 122A, 122B, 122C may be energized when the fan assembly 120 is in the deployed configuration depicted in FIG. 6. However, the one or more fans 122A, 122B, 122C may be first energized at any point from the stowed configuration to the fully deployed configuration.

An auxiliary cooling system consistent with the present disclosure may include a drive system for moving the fan assembly 120 between the rear of the chassis 102 and the front of the chassis 102, that is, for moving the fan assembly 120 between the stowed configuration and any deployed configuration. As shown in FIGS. 7 and 8, an embodiment of a drive system 125 may include a rack and pinion arrangement. The fan assembly 120 may include a drive pinion 126 that may engage a rack 128 at least partially extending between the front of the chassis 102 and the rear of the chassis 102. The fan assembly 120 may further include a drive motor 130 coupled to the drive pinion 126, either directly or through one or more intermediary components, e.g. a gear train. The drive motor 130 may be any suitable motor capable of driving the pinion 126 for moving the fan assembly 120 relative to the rack 128. In one embodiment the drive motor 130 may be a reversible motor suitable for driving the fan assembly 120 from the stowed configuration to the deployed configuration and from the deployed configuration to the stowed configuration.

According to another aspect, a control system may be used for controlling the movement of the fan assembly 120 such that the drive motor 130 may be de-activated when the fan assembly 120 reached the end of travel toward the deployed configuration and/or toward the stowed configuration. The control system may employ one or more limit switches, linear position sensors, etc. that may be used to control the movement of the fan assembly 120. Additionally, or alternatively, the drive motor 130 may be a stepper motor or a servo motor. In an embodiment utilizing a stepper motor or a servo motor for the drive motor 130, movement of the fan assembly 120 may be controlled based on the pitch of the rack and pinion and number of rotations of the drive motor 130.

As shown, the rack 128 may be provided with the guide rail 124. This arrangement may facilitate assembly of the auxiliary cooling system. In an embodiment in which the rack 128 of the drive system 125 is provided with the guide rails 124, positioning the guide rail 124 relative to the chassis 102 may also serve to properly position the rack 128 within the chassis 102. In one embodiment, the rack 128 may be an integral part of the guide rail 124, and/or may be pre-assembled to the guide rail 124, thereby reducing the number of individual components that are separately assembled to the chassis 102. According to alternative embodiments, the rack 128 may be provided as a separate component from the guide rail 124 and/or may be separately assembled to the chassis 102.

Various alternative mechanisms may be employed for translating the fan assembly between the stowed configuration and the deployed configuration. In various alternative embodiments, the drive system may utilize features such as lead screws, flexible helical drives, belt drives, chain drives, etc. for moving the fan assembly between the stowed configuration and the deployed configuration. Consistent with one or more of the alternative drive system embodiments, the drive motor may be coupled to the chassis, guide rail, or other feature rather than being disposed on the fan assembly.

As mentioned above, according to one embodiment moving the fan assembly 120 between a stowed configuration and a deployed configuration may include rotating the fan assembly 120, for example between a flat or horizontal orientation and an upright or vertical orientation. Referring to FIGS. 4 through 6 as well as to FIGS. 9 and 10, an embodiment of an arrangement or system that may suitably be used for rotating a fan assembly 120 is depicted. As shown in FIG. 10, a spring 132 may be provided biasing the fan assembly 120 toward an upright position. In the illustrated embodiment the spring 132 is shown as a leaf spring. Various other spring configurations may also be employed to bias the fan assembly toward an upright orientation, including torsion springs, coil spring arrangements, etc. Similarly, various elements other than a spring may be employed to bias the fan assembly toward an upright orientation.

As shown in FIGS. 9 and 10, as well as FIGS. 4-6, the system 100 may include a guide 134 for controlling the rotation of the fan assembly 120 under the biasing action of the spring 132. As shown in FIGS. 4 and 9, when the fan assembly 120 is in the stowed configuration, the fan assembly 120 may be held in a flat or horizontal orientation by the guide 134 against the biasing action of the spring. Turning to FIG. 5, as the fan assembly 120 moves toward the deployed configuration, the fan assembly 120 may begin to move toward the front of the chassis 102 and past the guide 134. The arcuate shape of the guide 134 may allow the fan assembly 120 to begin to rotate from the flat or horizontal orientation to the upright or vertical orientation. As the fan assembly 120 continues to pass the guide 134, the fan assembly 120 may continue to rotate to an upright or vertical orientation under the bias of the spring, until the fan assembly 120 is in fully upright orientation as shown in FIG. 6.

In a similar manner, when the fan assembly 120 is moved from a deployed configuration to a stowed configuration, the guide 134 may initiate and/or control the rotation of the fan assembly 120 from an upright or vertical orientation to a flat or horizontal orientation. In the illustrated embodiment, as the fan assembly 120 is moved from the deployed configuration, the fan assembly 120 may contact the guide 134. The fan assembly 120 may rotate forward, i.e., the top of the fan assembly 120 may rotate toward the front of the chassis 102, from contact with the guide 134 as the fan assembly 120 continues to move toward the stowed configuration. As the fan assembly 120 continues to move further toward the stowed configuration, the fan assembly 120 may be rotated to a flat or horizontal orientation and may be maintained in the flat or horizontal orientation by the guide 134 under the biasing action of the spring.

In the illustrated embodiment, the guide 134 has an arcuate or curved shape. The arcuate or curved shape of the guide 134 may control the rotation of the fan assembly between a flat or horizontal orientation and an upright or vertical orientation, and from the upright or vertical orientation to the flat or horizontal orientation. According to various alternative embodiments, the guide may have an angled shape or an angled and arcuate shape for controlling the rotation of the fan assembly.

Rotation of the fan assembly between the generally flat or horizontal stowed orientation and the generally upright or vertical deployed orientation may be achieved using various alternative mechanisms and/or arrangements. According to one alternative embodiment, the fan assembly may be pivotally arranged relative to the chassis. For example, the fan assembly may be pivotally carried on the guide rails. An electro-mechanical actuator, such as a servo, may be associated with the fan assembly to rotate or pivot the fan assembly between a flat or horizontal orientation and an upright or vertical orientation in response to a control signal. According to the foregoing embodiment, the control signal may be provided by a position sensor or switch that may indicate the state of the fan assembly, i.e., in a stowed configuration or a deployed configuration, etc. In still further embodiments, a guide rail may be provided capable of controlling the movement of the top portion of the fan assembly to an upright position. Other embodiments may use, for example, a cam feature to rotate the fan assembly between the flat or horizontal orientation and the upright or vertical orientation. Still other variations and alternatives may also be employed such as a gear or gear train, etc.

The illustrated and described embodiments of the auxiliary cooling system generally provide a system having a selectively deployable fan assembly that may translate and rotate to move between the stowed configuration and the deployed configuration. According to alternative embodiments consistent with the present disclosure, it is not necessary for the fan assembly to both translate and rotate in moving between the stowed configuration and the deployed configuration. For example, in a stowed configuration the fan assembly may be oriented in a vertical position and may be disposed in a rear portion of the inlet plenum, for example against and/or adjacent to a rear wall portion of the chassis. In such a stowed configuration the fan assembly may generally be out of the airflow though the air inlet plenum. The stowed fan assembly may, therefore, only impart a minor restriction and/or resistance on air flow through the chassis. The fan assembly may be deployed by translating the fan assembly forward toward the front, or intake region of the plenum, while maintaining the fan assembly in the vertical position. According to a related embodiment, in a stowed configuration, the fan assembly may be disposed adjacent to the intake region of the inlet plenum and oriented in a horizontal, or flat, position. In such a stowed configuration, the fan assembly may impart only a small restriction and/or resistance on airflow into the chassis, resulting in a decrease in the height of the intake region of the air inlet plenum approximately equal to the thickness of the fan assembly. The fan assembly may be rotated to the vertical orientation, thereby positioning the fan assembly adjacent to the intake region of the air inlet plenum. Various other embodiments may be provided in which the selectively deployable fan assembly is not both translated and rotated between a stowed configuration and a deployed configuration.

The illustrated embodiments of the primary chassis cooling system provides a pull-though cooling system, in which primary cooling fans 114 are disposed adjacent to an air outlet from the chassis 102. The primary cooling fan 114 accordingly pulls air into the chassis 102 at the air inlet plenum 110, draws the air through the chassis 102 across any printed circuit boards 104 and/or circuit cards 106, 108, etc. disposed within the chassis 102. The air then passes through the primary cooling fans 114 and is then expelled from the chassis 102 through the air outlet of the chassis. The illustrated auxiliary cooling system, by contrast, is configured as a push-through cooling system. That is, the fan assembly 120 including the one or more fans 122A, 122B, 122C is disposed adjacent to the air inlet of the air plenum 110 when the fan assembly is in a deployed configuration. The fans 122A, 122B, 122C of the fan assembly 120 may draw cooler air from the exterior of the chassis 102 and force the air through the chassis 102, across any circuit boards 104 and/or cards 106, 108 disposed within the chassis 102. The air forced through the chassis 102 by the auxiliary fan assembly 120 may then exit the chassis 102 through the air outlet adjacent the top of the chassis 102.

According to various alternative embodiments, the primary chassis cooling system may be configured as a push-through cooling system and the auxiliary cooling system may be configured as a pull-through cooling system. According to yet another embodiment, both the primary cooling system and the auxiliary cooling system may be configured as either a pull-through or a push-through cooling system. In such an embodiment, the fan assembly of the auxiliary cooling may be deployed behind the primary cooling system. As such, the fan assembly may achieve a stacked configuration with the fan of the primary cooling system. Various other configurations consistent with the present disclosure will also be apparent to those having skill in the art.

Figure 11:
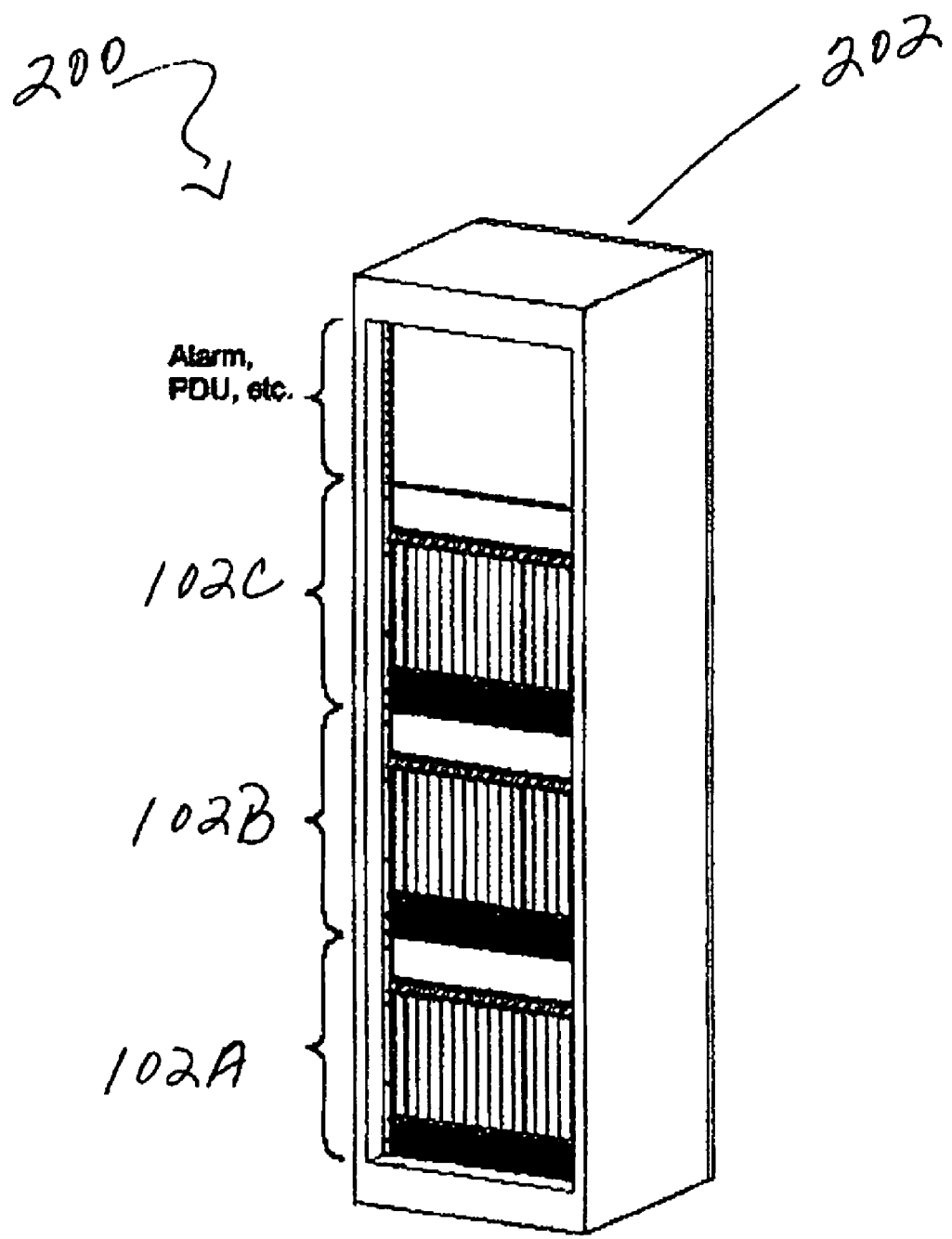
FIG. 11 is a schematic illustration of a frame that may suitably be used in connection with the present disclosure.

Referring to FIG. 11, a system 200 consistent with the present disclosure is illustrated. As depicted, the system 200 may include a frame 202. The frame 202 may accommodate and electrically couple a plurality of chassis 102A, 102B, and 102C. One or more of the chassis 102A, 102B, 102C may include an auxiliary cooling system consistent with any embodiment described herein. The frame 202 may include, for example, a power supply for providing power to each of the individual chassis 102A, 102B, 102C disposed in the frame 202, etc. Additionally, as mentioned above, the frame may electrically couple one or more of the chassis 102A, 102B, 102C to at least one other chassis.

According to an alternative embodiment, rather than being disposed in a common frame, a system consistent with the present disclosure may include a plurality of chassis that may be individually hardwired to one another. One or more of the plurality of chassis may include an auxiliary cooling system consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with the foregoing description, the present disclosure may provide a selectively deployable auxiliary cooling system. According to one aspect, the auxiliary cooling system may provide increased airflow through the chassis to provide an increased cooling capacity. The auxiliary cooling system may be employed, for example, in conditions of increased ambient temperature, increased heat generation by components within the chassis, etc. When additional airflow through the chassis is not needed and/or desired, the auxiliary cooling system may be turned off. The acoustic noise attributed to chassis cooling may be reduced to only the noise generated by the primary chassis cooling system when the auxiliary cooling system is not in use.

According to one aspect, the auxiliary cooling system may extend the available cooling capacity for processors and chipsets, especially in confined spaces, such as may be associated with small or high density form factors. An auxiliary cooling system consistent with the present disclosure may, therefore, increase the amount of power a given chassis can dissipate. The amount of heat generating components that can be used in a single chassis may correspondingly be increased. Furthermore, the auxiliary cooling system may be applied to many different form factors as either an original equipment system or as an add-on system installed either before or after the chassis is placed in service.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
   a frame comprising at least one chassis;
   an airflow path through said chassis including an intake region and an exhaust region;

at least one circuit board configured to be coupled to said at least one chassis, said at least one circuit board including at least one heat generating component;

a primary cooling system including at least one fan configured to provide a first airflow through said airflow path to convectively cool said at least one heat generating component of said at least one circuit board;

a selectively deployable fan assembly comprising at least one fan; and a drive system configured to move said at least one fan assembly between a stowed configuration wherein said fan assembly is at least partially retracted into and removed from said airflow path to permit airflow through said airflow path and a deployed configuration wherein said fan assembly is positioned adjacent to said intake region and is configured to provide a second airflow through said airflow path to convectively cool said at least one heat generating component of said at least one circuit board.

2. A system according to claim 1, wherein said chassis comprises an Advanced Telecommunications Computing Architecture chassis.

3. A system according to claim 1, wherein said selectively deployable fan assembly is positioned adjacent to a rear portion of an air inlet plenum when said fan assembly is in said stowed configuration.

4. A system according to claim 1, wherein said selectively deployable fan assembly is positioned adjacent to said intake region when said fan assembly is in said deployed configuration.

5. A system according to claim 1, wherein said drive system comprises a rack coupled to said chassis and a pinion coupled to said fan assembly, and said pinion is coupled to a motor capable of driving said pinion.

6. A system according to claim 1, further comprising a control system comprising a temperature sensor, said fan assembly moving between said stowed configuration and said deployed configuration in response to a temperature measured by said temperature sensor.

7. A system according to claim 6, said fan assembly moving between said stowed configuration and said deployed configuration based on changes in a temperature measured by said temperature sensor.

8. An apparatus comprising:
a chassis;
an airflow path through said chassis including an intake region and an exhaust region;
a selectively deployable fan assembly comprising at least one fan, said selectively deployable fan assembly movable between a deployed configuration wherein said fan assembly is positioned adjacent to said intake region and is configured to provide an airflow through said airflow path and a stowed configuration wherein said fan assembly is at least partially retracted into and removed from said airflow path to permit aifflow through said aifflow path; and
a drive system configured to move said fan assembly between said stowed configuration and said deployed configuration.

9. An apparatus according to claim 8, wherein said chassis comprises an Advanced Telecommunication Computing Architecture chassis.

10. An apparatus according to claim 8, wherein said selectively deployable fan assembly is positioned adjacent to a rear portion of an air inlet plenum of said chassis when said selectively deployable fan assembly is in said stowed configuration.

11. An apparatus according to claim 8, wherein said selectively deployable fan assembly is in a generally horizontal orientation when said selectively deployable fan assembly is in said stowed configuration.

12. An apparatus according to claim 8, wherein said selectively deployable fan assembly is in generally vertical orientation when said selectively deployable fan assembly is in said deployed configuration.

13. An apparatus according to claim 8, wherein said drive system comprises a guide rail capable of controlling movement of said selectively deployable fan assembly between said stowed configuration and said deployed configuration.

14. An apparatus according to claim 8, wherein said drive system comprises a rack and pinion.

15. An apparatus according to claim 8, further comprising a rotation means capable of moving said fan assembly between a generally horizontal orientation and a generally vertical orientation.

16. An apparatus according to claim 15, wherein said rotation means comprises a spring biasing said fan assembly toward said generally vertical orientation and further comprising a guide capable of pivoting said fan assembly between said generally horizontal orientation and said generally vertical orientation.

17. A method for providing increased airflow through a chassis comprising:
providing a chassis comprising at least one selectively deployable fan assembly and an airflow path through said chassis including an intake region and an exhaust region;
moving said at least one fan assembly from a stowed configuration wherein said at least one fan assembly is at least partially retracted into and removed from an airflow path to permit airflow through said airflow path to a deployed configuration wherein said at least one fan assembly is positioned adjacent to said intake region and is configured to provide an airflow through said airflow path; and
energizing said at least one fan assembly when said at least one fan assembly is in said deployed configuration.

18. A method according to claim 17, wherein said at least one fan assembly is disposed in a rear portion of an air inlet plenum when said at least one fan assembly is in said stowed configuration.

19. A method according to claim 18, wherein said at least one fan assembly is adjacent to said intake region of an air inlet plenum when said at least one fan assembly is in said deployed configuration.

20. A method according to claim 17, wherein moving said at least one fan assembly from said stowed configuration to said deployed configuration comprises rotating said fan assembly from a generally horizontal orientation to a generally vertical orientation.

\* \* \* \* \*